United States Patent  (10) Patent No.: US 10,559,422 B2
Ha et al.  (45) Date of Patent: Feb. 11, 2020

(54) ELECTRONIC DEVICE AND METHOD FOR FABRICATING THE SAME USING TREATMENT WITH NITROGEN AND HYDROGEN

(71) Applicant: SK hynix Inc., Icheon-Si (KR)

(72) Inventors: Ga-Young Ha, Icheon-si (KR); Ki-Seon Park, Seoul (KR); Jong-Han Shin, Seoul (KR); Jeong-Myeong Kim, Hwaseong-si (KR); Bo-Kyung Jung, Cheongju-si (KR)

(73) Assignee: SK hynix Inc., Icheon-si (KR)

( * ) Notice: Subject to any disclaimer, the term of this patent is extended or adjusted under 35 U.S.C. 154(b) by 225 days.

(21) Appl. No.: 15/482,548

(22) Filed: Apr. 7, 2017

(65) Prior Publication Data

US 2018/0114639 A1 Apr. 26, 2018

(30) Foreign Application Priority Data

Oct. 26, 2016 (KR) .......................... 10-2016-0139988

(51) Int. Cl.
*H01F 41/30* (2006.01)
*H01F 10/32* (2006.01)
(Continued)

(52) U.S. Cl.
CPC ......... *H01F 41/307* (2013.01); *G01R 33/098* (2013.01); *G11B 5/3909* (2013.01);
(Continued)

(58) Field of Classification Search
CPC ....... H01L 43/08; H01L 43/12; H01L 27/222; G01R 33/098; G11B 5/3909;
(Continued)

(56) References Cited

U.S. PATENT DOCUMENTS 6,610,571 B1 * 8/2003 Chen ................. H01L 21/31116
257/384
2015/0249206 A1 * 9/2015 Kim ....................... H01L 43/02
257/421
2017/0358739 A1 12/2017 Kim et al.

FOREIGN PATENT DOCUMENTS

KR  10-2006-0008166      1/2006
KR    1020060008166  *  1/2006
KR  10-2017-0140819    12/2017

* cited by examiner

*Primary Examiner* — Duy T Nguyen
(74) *Attorney, Agent, or Firm* — Perkins Coie LLP

(57) ABSTRACT

A method for fabricating an electronic device including a semiconductor memory includes: forming a variable resistance element over a substrate, the variable resistance element including a metal-containing layer and an MTJ (Magnetic Tunnel Junction) structure which is located over the metal-containing layer and includes a free layer having a variable magnetization direction, a pinned layer having a fixed magnetization direction and a tunnel barrier layer interposed between the free layer and the pinned layer; forming an initial spacer containing a metal over the variable resistance element; performing an oxidation process to transform the initial spacer into a middle spacer including an insulating metal oxide; and performing a treatment using a gas or plasma including nitrogen and hydrogen to transform the middle spacer produced by the oxidation process into a final spacer including an insulating metal nitride or an insulating metal oxynitride.

13 Claims, 11 Drawing Sheets

(51) Int. Cl.
    *H01F 41/32*         (2006.01)
    *H01L 43/08*         (2006.01)
    *H01L 43/12*         (2006.01)
    *G01R 33/09*        (2006.01)
    *G11B 5/39*          (2006.01)

(52) U.S. Cl.
    CPC ......... *H01F 10/3231* (2013.01); *H01F 41/32*
        (2013.01); *H01L 43/08* (2013.01); *H01L 43/12*
            (2013.01); *H01F 10/3254* (2013.01); *H01F*
                                        *10/3286* (2013.01)

(58) Field of Classification Search
    CPC ............ H01F 10/3231; H01F 10/3254; H01F
                   10/3286; H01F 41/307; H01F 41/32
    See application file for complete search history.

ELECTRONIC DEVICE AND METHOD FOR FABRICATING THE SAME USING TREATMENT WITH NITROGEN AND HYDROGEN

CROSS-REFERENCE TO RELATED APPLICATIONS

This patent document claims priority of Korean Patent Application No. 10-2016-0139988, entitled "ELECTRONIC DEVICE AND METHOD FOR FABRICATING THE SAME" and filed on Oct. 26, 2016, which is incorporated herein by reference in its entirety.

TECHNICAL FIELD

This patent document relates to memory circuits or devices and their applications in electronic devices or systems.

BACKGROUND

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted for the semiconductor devices. Such semiconductor devices include semiconductor devices which can store data using a characteristic that they are switched between different resistant states according to an applied voltage or current, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device which is capable of improving characteristics of a variable resistance element and fabricating processes.

In an implementation, a method for fabricating an electronic device including a semiconductor memory includes: forming a variable resistance element over a substrate, the variable resistance element including a metal-containing layer and an MTJ (Magnetic Tunnel Junction) structure which is located over the metal-containing layer and includes a free layer having a variable magnetization direction, a pinned layer having a fixed magnetization direction and a tunnel barrier layer interposed between the free layer and the pinned layer; forming an initial spacer containing a metal over the variable resistance element; performing an oxidation process to transform the initial spacer into a middle spacer including an insulating metal oxide; and performing a treatment using a gas or plasma including nitrogen and hydrogen to transform the middle spacer produced by the oxidation process into a final spacer including an insulating metal nitride or an insulating metal oxynitride.

Implementations of the above method may include one or more the following.

The performing of the oxidation process includes performing an over-oxidation process, and providing an oxidized surface portion of the variable resistance element. The performing of the treatment includes reducing the oxidized surface portion of the variable resistance element. The performing of the oxidation process further includes performing a natural oxidation. The initial spacer and the metal-containing layer include the same metal. The method further comprises, after performing of the oxidation process and before the performing the treatment, forming an additional spacer over the middle spacer. The additional spacer has a thickness thinner than that of the middle spacer. The additional spacer is porous in comparison with the middle spacer. The additional spacer includes a silicon oxide, a silicon nitride or a combination thereof. The method further comprises, after performing of the oxidation process and before the performing the treatment, performing a first treatment using a gas or plasma which includes nitrogen to a surface portion or whole of the middle spacer. The method further comprises, after performing of the oxidation process and the first treatment and before the performing the treatment, performing a second treatment using a gas or plasma which includes oxygen.

In another implementation, a method for fabricating an electronic device including a semiconductor memory includes: forming a variable resistance element over a substrate, the variable resistance element including a metal-containing layer and an MTJ (Magnetic Tunnel Junction) structure which is located over the metal-containing layer and includes a free layer having a variable magnetization direction, a pinned layer having a fixed magnetization direction and a tunnel barrier layer interposed between the free layer and the pinned layer; forming an initial spacer containing a metal over the variable resistance element; performing an oxidation process to transform the initial spacer into a middle spacer including an insulating metal oxide; and performing a treatment using a gas or plasma including nitrogen to transform the middle spacer formed by the oxidation process into a final spacer including an insulating metal oxynitride.

Implementations of the above method may include one or more the following.

The performing of the oxidation process includes providing a surface portion of the variable resistance not oxidized. The performing of the oxidation process includes an over-oxidation process, and providing an oxidized surface portion of the variable resistance element. The performing of the oxidation process further includes performing a natural oxidation. The performing of the treatment includes providing the final spacer having a surface portion including the insulating metal oxynitride, and a remaining portion including the insulating metal oxide. The method further comprises, after the performing of the treatment: performing an additional treatment using a gas or plasma which includes oxygen to increase a content of oxygen in a surface portion of the final spacer. The initial spacer and the metal-containing layer include the same metal.

In another implementation, an electronic device includes: a semiconductor memory, wherein the semiconductor memory may include: a variable resistance element including a metal-containing layer and an MTJ (Magnetic Tunnel Junction) structure which is located over the metal-containing layer and includes a free layer having a variable magnetization direction, a pinned layer having a fixed magnetization direction and a tunnel barrier layer interposed between the free layer and the pinned layer; and a spacer formed over the variable resistance element and including a surface portion that includes an insulating metal oxynitride and a remaining portion that is surrounded by the surface portion and includes an insulating metal oxide.

Implementations of the above device may include one or more the following.

The surface portion includes a first region and a second region, the first region formed over the second region and having a higher oxygen content than the second region of the surface portion of the spacer. The spacer and the metal-containing layer include the same metal.

In another implementation, an electronic device includes: a semiconductor memory, wherein the semiconductor memory may include: a variable resistance element including a metal-containing layer and an MTJ (Magnetic Tunnel Junction) structure which is located over the metal-containing layer and includes a free layer having a variable magnetization direction, a pinned layer having a fixed magnetization direction and a tunnel barrier layer interposed between the free layer and the pinned layer; and a spacer formed over the variable resistance element and including an insulating metal oxynitride, wherein a surface portion of the spacer has a higher oxygen content than a remaining portion of the spacer, which is surrounded by the surface portion.

Implementations of the above device may include one or more the following.

The spacer and the metal-containing layer include the same metal.

In another implementation, an electronic device includes: a semiconductor memory, wherein the semiconductor memory may include: a variable resistance element including a metal-containing layer and having a surface portion with a reduced insulating property as compared to when the surface portion is oxidized; and a spacer formed over the variable resistance element and including an insulating a metal nitride or insulating metal oxynitride.

Implementations of the above device may include one or more the following.

The variable resistance element further includes an MTJ (Magnetic Tunnel Junction) structure located over the metal-containing layer and including a free layer having a variable magnetization direction, a pinned layer having a fixed magnetization direction and a tunnel barrier layer interposed between the free layer and the pinned layer. The spacer includes FeN, HfN, AlN, FeON, HfON, or AlON. The spacer includes a fist layer and a second layer formed over the first layer.

The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

The electronic device may further include a data storage system which includes: a storage device configured to store data and conserve stored data regardless of power supply; a controller configured to control input and output of data to and from the storage device according to a command inputted from an outside; a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

The electronic device may further include a memory system which includes: a memory configured to store data and conserve stored data regardless of power supply; a memory controller configured to control input and output of data to and from the memory according to a command inputted from an outside; a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

These and other aspects, implementations and associated advantages are described in greater detail in the drawings, the description and the claims.

DETAILED DESCRIPTION

Figure 1A:
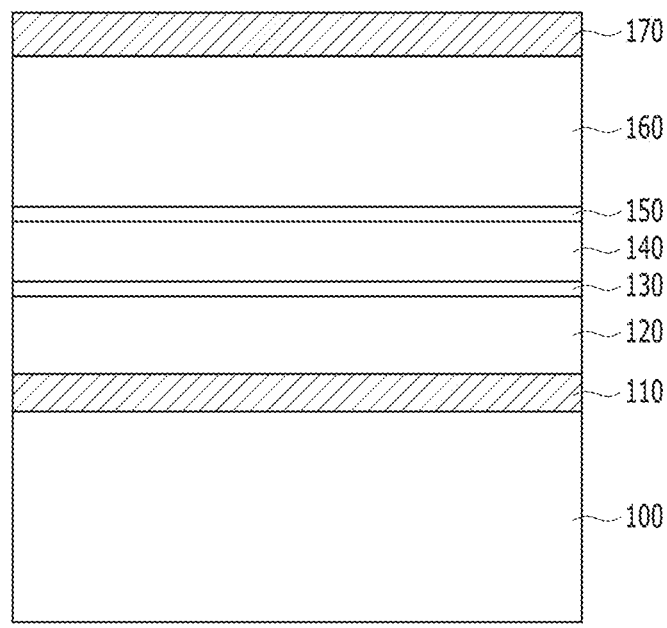
FIGS. 1A to 1C are cross-sectional views describing a semiconductor memory and a method for fabricating the same in accordance with a comparative example.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

A variable resistance element may is structured to exhibit different resistance states of different resistance values for representing different data for data storage. A resistance state of the variable resistance element 14 may be changed by applying a voltage or current of a sufficient magnitude to the variable resistance element 14. The variable resistance element can be operated to switch between different resistance states according to a supplied voltage or current to store different data. A plurality of variable resistance elements may be arranged to constitute a memory cell array for storing data.

A variable resistance element according to implementations of the present disclosure may include an MTJ (Magnetic Tunnel Junction) structure. The MTJ structure may include a free layer having a variable magnetization direction, a pinned layer having a fixed magnetization direction, and a tunnel barrier layer interposed between the free layer and the pinned layer and allowing tunneling of electrons if necessary, for example, during a data writing operation which changes a resistance state of the variable resistance element. When the magnetization directions of the free layer and the pinned layer are parallel to each other, the variable resistance element may be in a low resistance state and, for example, may store data '1'. Conversely, when the magnetization directions of the free layer and the pinned layer are anti-parallel to each other, the variable resistance element may be in a high resistance state and, for example, may store data '0'. In some implementations, the variable resistance element can be configured to store data "0" when the magnetization directions of the free layer and the pinned layer are parallel to each other and store data "1" when the magnetization directions of the free layer and the pinned layer are anti-parallel to each other. The magnetization direction of the free layer may be changed by spin transfer torque. In addition to the MTJ structure, the variable resistance element may further include one or more layers to improve characteristics of the MTJ structure or facilitate fabricating processes.

Prior to describing implementations of the present disclosure, a comparative example and a problem thereof will be described to be compared with the implementations.

Figure 1B:
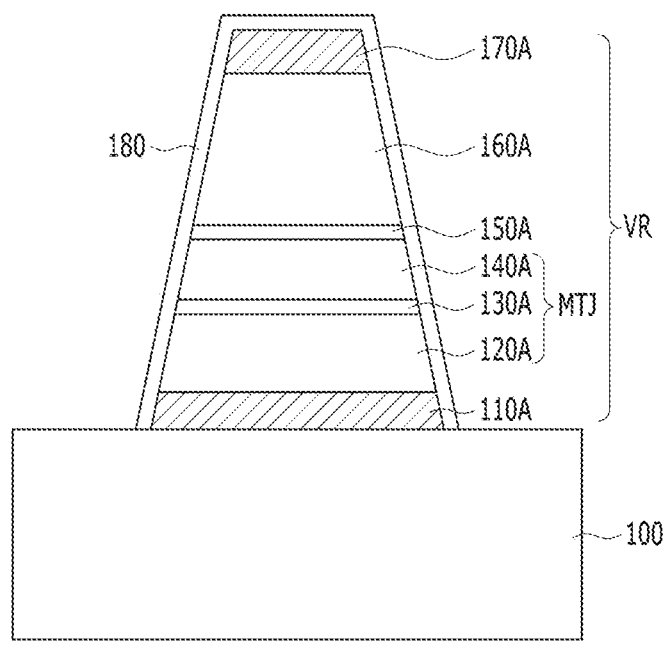
Figure 1C:
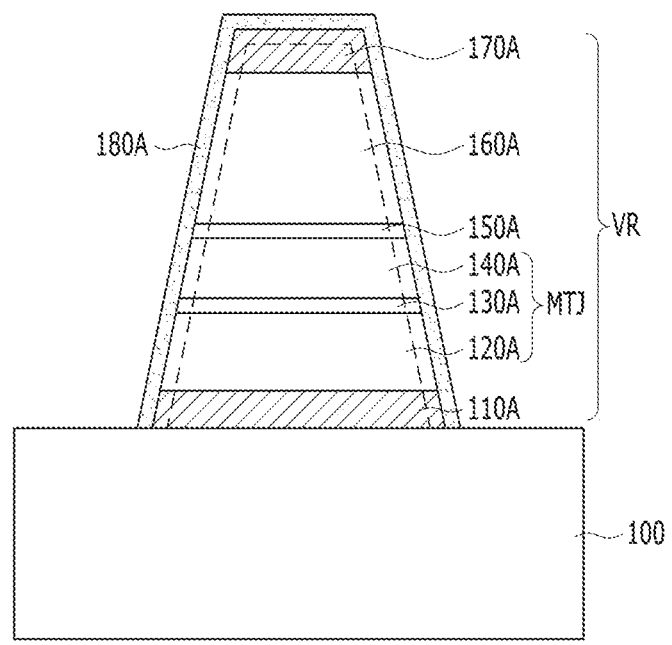

FIGS. 1A to 1C are cross-sectional views describing a semiconductor memory and a method for fabricating the same in accordance with a comparative example.

Referring to FIG. 1A, a substrate 100 in which a certain lower structure (not shown) is formed may be provided. The lower structure may include a transistor for controlling an access to a variable resistance element, a contact plug coupling the transistor with the variable resistance element and arranged between the transistor and the variable resistance element and the like.

Then, material layers 110 to 170 for forming the variable resistance element may be formed over the substrate 100. In this comparative example, the material layers 110 to 170 may include a lower electrode layer 110, a free layer 120, a tunnel barrier layer 130, a pinned layer 140, an exchange coupling layer 150, a magnetic correction layer 160 and an upper electrode layer 170 which are sequentially stacked over the substrate 100. The free layer 120, the tunnel barrier layer 130 and the pinned layer 140 may form an MTJ (Magnetic Tunnel Junction) structure. The lower electrode layer 110 and the upper electrode layer 170 may be located at a lowermost portion and an uppermost portion of the variable resistance element, respectively, and function to receive a voltage or current. Furthermore, the lower electrode layer 110 may help the free layer 120 to grow to have a desired crystalline structure, and the upper electrode layer 170 may serve as a hard mask in a patterning process of the variable resistance element which will be described later. The magnetic correction layer 160 may be located over the pinned layer 140 and offset or reduce an influence of stray magnetic field generated by the pinned layer 140, and for this, the magnetic correction layer 160 may have a magnetization direction opposite to the magnetization direction of the pinned layer 140. The exchange coupling layer 150 may be interposed between the pinned layer 140 and the magnetic correction layer 160 and provide an exchange coupling between the pinned layer 140 and the magnetic correction layer 160.

Referring to FIG. 1B, a variable resistance element VR in which a lower electrode layer pattern 110A, a free layer pattern 120A, a tunnel barrier layer pattern 130A, a pinned layer pattern 140A, an exchange coupling layer pattern 150A, a magnetic correction layer pattern 160A and an upper electrode layer pattern 170A are stacked may be formed by forming a mask pattern (not shown) for patterning the variable resistance element VR over the upper electrode layer 170, and etching the material layers 110 to 170 by using the mask pattern as an etching barrier.

Here, during the etching process for forming the variable resistance element VR, etch byproducts may be redeposited on the variable resistance element VR. As a result, an initial spacer 180 resulting from the etch byproducts may be formed over a surface of the variable resistance element VR including a top surface and a side of the variable resistance element VR. Among the various layers etched, the lowermost layer, that is, the last etched layer of the variable resistance element VR tends to contribute the most to the formation of the initial spacer 180. This is because most of etch byproducts which are redeposited in an earlier etching process are removed again in a later etching process as the etching process proceeds. As a result, the initial spacer 180 formed over the variable resistance element VR may mainly contain or include a material which is included in the lower electrode layer pattern 110A. The lower electrode layer pattern 110A may be formed of or include a metal-containing material such as a metal, a metal nitride, etc. Therefore, the initial spacer 180 may contain a metal, and thus a leakage current through the initial spacer 180 may occur. For example, if the initial spacer 180 contains a metal, while the free layer pattern 120A and the pinned layer pattern 140A need to be insulated from each other, there are possibilities that the free layer pattern 120A and the pinned layer pattern 140A are electrically coupled with each other through the initial spacer 180. In order to solve this problem, a subsequent process of FIG. 1C may be performed.

Referring to FIG. 1C, the initial spacer 180 containing a metal may be transformed into a spacer 180A containing a metal oxide by performing an oxidation process to a resultant structure of FIG. 1B. Since most of metal oxides have an insulating property, a leakage current through the spacer 180A may be prevented.

However, in this oxidation process of oxidizing the initial spacer 180, not only the initial spacer 180 but also a portion of the variable resistance element VR, which is adjacent to the initial spacer 180 (see an outer portion of a dotted line), may be oxidized. In this case, characteristics of the variable resistance element VR may be deteriorated. For example, when sidewalls of the magnetic correction layer pattern 160A are oxidized, a substantially functioning portion of the magnetic correction layer pattern 160A may be reduced, and thus a magnetic correction function of the magnetic correction layer pattern 160A may not be performed properly. Therefore, operating characteristics of the variable resistance element VR may be deteriorated. Also, for example, when the upper electrode layer pattern 170A is formed of or include a metal-containing material and an upper portion of the upper electrode layer pattern 170A may be oxidized to include an upper insulating metal oxide. Therefore, when a contact plug (not shown) is formed over the upper electrode layer pattern 170A to be coupled to the upper electrode layer pattern 170A in a subsequent process, a contact resistance between the contact plug and the upper electrode pattern 170A may increase due to the presence of this insulating metal oxide. Furthermore, when the upper electrode layer pattern 170A is formed of or include a metal-containing material which is susceptible to oxidation, such as a material containing tungsten, the upper portion of the upper electrode layer pattern 170A may be abnormally oxidized. In this case, when the contact plug is formed over the upper electrode layer pattern 170A, a contact resistance may be undesirably increased and a contact resistance distribution may increase.

Despite the problems involved with the oxidation above, the oxidation process still needs to be performed with a certain intensity in order to sufficiently oxidize initial spacer 180 to provide desired insulation and to reduce a leakage current in the VR. Therefore, in the above process for fabrication of the VR, there is a trade-off between the need to oxidize the spacer 180 over the VR and the need to avoid or reduce undesired oxidization in the upper portion of the VR.

The disclosed technology provides the present implementations of a semiconductor memory and its fabricating method that secure characteristics of a variable resistance element by solving the above problems which are in a trade-off relationship.

FIGS. 2A to 2E are cross-sectional views describing a semiconductor memory and a method for fabricating the same in accordance with an implementation of the present disclosure.

Figure 2A:
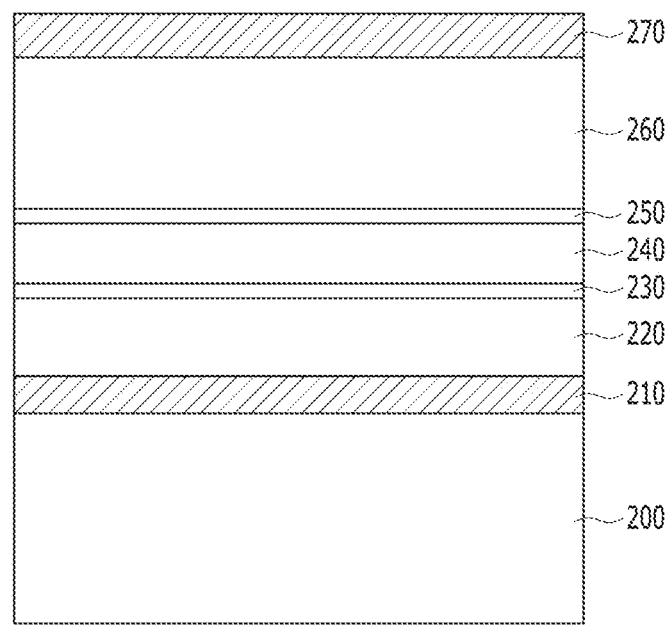
FIGS. 2A to 2E are cross-sectional views describing a semiconductor memory and a method for fabricating the same in accordance with an implementation of the present disclosure.

Referring to FIG. 2A, a substrate 200 in which a certain lower structure (not shown) is formed may be provided. The lower structure may include a switching element such as a transistor or diode for controlling an access to a variable resistance element, a contact plug for coupling the switching element with the variable resistance element between the switching element and the variable resistance element and the like.

Then, material layers 210 to 270 for forming the variable resistance element may be formed over the substrate 200. In this implementation, the material layers 210 to 270 may include a lower electrode layer 210, a free layer 220, a tunnel barrier layer 230, a pinned layer 240, an exchange coupling layer 250, a magnetic correction layer 260 and an upper electrode layer 270 which are sequentially stacked over the substrate 200.

Here, the free layer 220 having a variable magnetization direction, the pinned layer 240 having a fixed magnetization direction, and the tunnel barrier layer 230 interposed between the free layer 220 and the pinned layer 240 and allowing tunneling of electrons if necessary, for example, during a data writing operation that changes a resistance state of the variable resistance element may form an MTJ (Magnetic Tunnel Junction) structure. Each of the free layer 220 and the pinned layer 240 may have a single-layered structure or multi-layered structure that includes a ferromagnetic material. The ferromagnetic material may include an alloy containing Fe, Ni or Co as its major component, for example, Fe—Pt alloy, Fe—Pd alloy, Co—Fe alloy, Co—Pd alloy, Co—Pt alloy, Co—Fe—Ni alloy, Fe—Ni—Pt alloy, Co—Fe—Pt alloy, Co—Ni—Pt alloy, Co—Fe—B alloy or others, or a stack structure of or including Co/Pt, Co/Pd, or others. Positions of the free layer 220 and the pinned layer 240 may be changed with each other with regard to the tunnel barrier layer 230 therebetween. That is, in another implementation, the free layer 220 may be located over the tunnel barrier layer 230, and the pinned layer 240 may be located under the tunnel barrier layer 230 and over the lower electrode layer 210. The tunnel barrier layer 230 may have a single-layered structure or multi-layered structure including a metal oxide, such as MgO, CaO, SrO, TiO, VO, NbO or others.

The lower electrode layer 210 may be located at a lowermost portion of the variable resistance element and function as an electrical passage for a voltage or current. Furthermore, the lower electrode layer 210 may help a magnetic layer which is located on the lower electrode layer 210 to grow to have a desired crystalline structure. For example, the lower electrode layer 210 may have a certain crystalline structure to improve a perpendicular magnetic crystalline anisotropy of a magnetic layer located on the lower electrode layer 210. In this implementation, the lower electrode layer 210 may help a growth of the free layer 220 under the free layer 220. In another implementation, when the pinned layer 240 is located on the lower electrode layer 210 to be coupled to the lower electrode layer 210, the lower electrode layer 210 may help a growth of the pinned layer 240. The lower electrode layer 210 may include a metal-containing material. For example, the lower electrode layer 210 may have a single-layered structure or multi-layered structure including a metal such as Hf, Fe, Al, Mg, Zr, Nb, Mo, Ta, W or Ti, or an oxide of this metal, or a nitride of this metal.

The magnetic correction layer 260 may be located over the pinned layer 240 and offset or reduce an influence of stray magnetic field generated by the pinned layer 240, and thus a bias magnetic field in the free layer 220 due to the stray magnetic field of the pinned layer 240 may be reduced. For this, the magnetic correction layer 260 may have a magnetization direction opposite to the magnetization direction of the pinned layer 240. The magnetic correction layer 260 may have a single-layered structure or multi-layered structure including a ferromagnetic material.

The exchange coupling layer 250 may be interposed between the pinned layer 240 and the magnetic correction layer 260 and provide an exchange coupling between the pinned layer 240 and the magnetic correction layer 260. Specifically, the exchange coupling layer 250 may couple the magnetization direction of the pinned layer 240 and the magnetization direction of the magnetic correction layer 260 with each other in an antiparallel manner. The exchange coupling layer 250 may include a noble metal such as Ru, etc.

The upper electrode layer 270 may be located at an uppermost portion of the variable resistance element and function as an upper electrode of the variable resistance element and a hard mask in a patterning process of the variable resistance element which will be described later. The upper electrode layer 270 may have a single-layered structure or multi-layered structure including a metal such as Hf, Fe, Al, Mg, Zr, Nb, Mo, Ta, W or Ti, or an oxide of this metal, or a nitride of this metal.

Figure 2B:
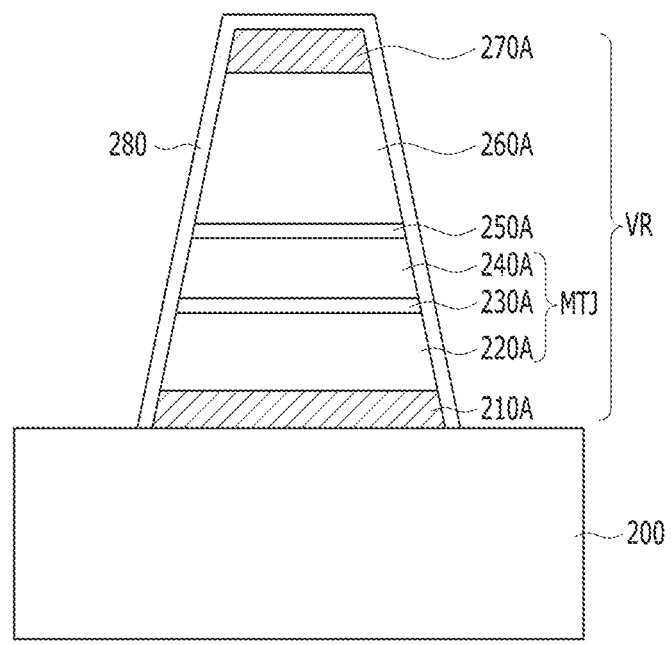

Referring to FIG. 2B, a variable resistance element VR in which a lower electrode layer pattern 210A, a free layer pattern 220A, a tunnel barrier layer pattern 230A, a pinned layer pattern 240A, an exchange coupling layer pattern 250A, a magnetic correction layer pattern 260A and an upper electrode layer pattern 270A are stacked may be formed by forming a mask pattern (not shown) for patterning the variable resistance element VR over the upper electrode layer 270, and etching the material layers 210 to 270 by using the mask pattern as an etching barrier. This etching process may be performed by a physical etching process such as an IBE (Ion Beam Etching) process.

Here, during the etching process for forming the variable resistance element VR, etch byproducts may be redeposited. As a result of the re-deposition of the etch byproducts, an initial spacer 280 may be formed over a surface of the variable resistance element VR. The initial spacer 280 may include a conductive material such as a metal, which is included in the variable resistance element VR. Specially, the initial spacer 280 may mainly contain a metal included in the lower electrode layer pattern 210A which is located at the lowermost portion of the variable resistance element VR.

Figure 2C:
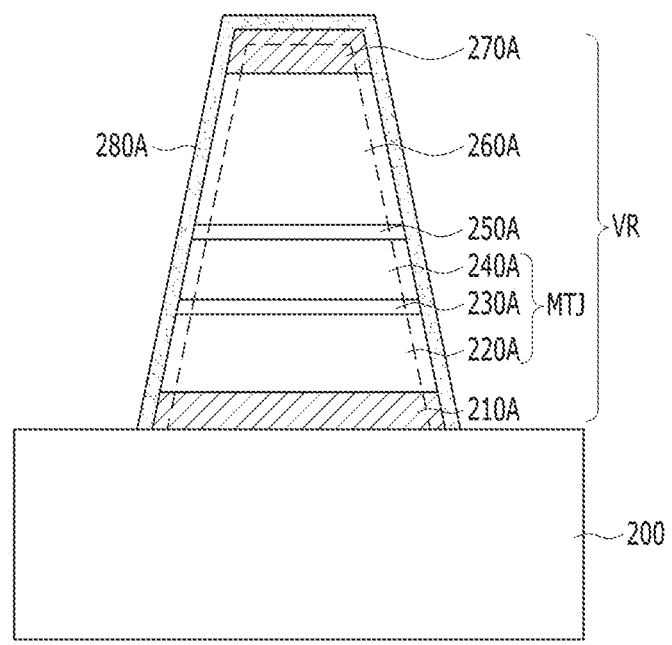

Referring to FIG. 2C, the initial spacer 280 containing a metal may be transformed into a middle spacer 280A containing a metal oxide by performing an oxidation process to a resultant structure of FIG. 2B. Through the oxidation process, the initial spacer 280 which has a conductive property may be transformed into the middle spacer 280A which has an insulating property.

This oxidation process may be performed in a single process or multiple processes. For example, only a first single oxidation process may be performed, or an oxidation process may be performed in plural processes including a first oxidation process and a second oxidation process. At this time, this oxidation process may include an over-oxidation process, and thus the metal contained in the initial spacer 280 may be completely oxidized so that the middle spacer 280A has a sufficient insulating property. If the oxidation process is performed in a single process, the first single oxidation process may be an over-oxidation process. Alternatively, if the oxidation process is performed in multiple processes including the first and second oxidation processes, the first oxidation process may be a natural oxidation process, and the second oxidation process may be an over-oxidation process which is performed by flowing an oxygen gas or an oxygen plasma treatment. Since the over-oxidation process completely oxidize the metal in the initial spacer, the oxidation process that is either the first single process or the multiple processes including the second oxidation process of the over-oxidation process, a leakage current through the middle spacer 280A can be prevented. In this oxidation process, a portion of the variable resistance element VR, which is adjacent to the middle spacer 280A, may be oxidized (see a portion of the variable resistance element VR formed outside of a dotted line). In this case, characteristics of the variable resistance element VR may be deteriorated. In order to prevent this deterioration of the characteristics of the variable resistance element VR, a subsequent process of FIG. 2D will be performed.

Figure 2D:
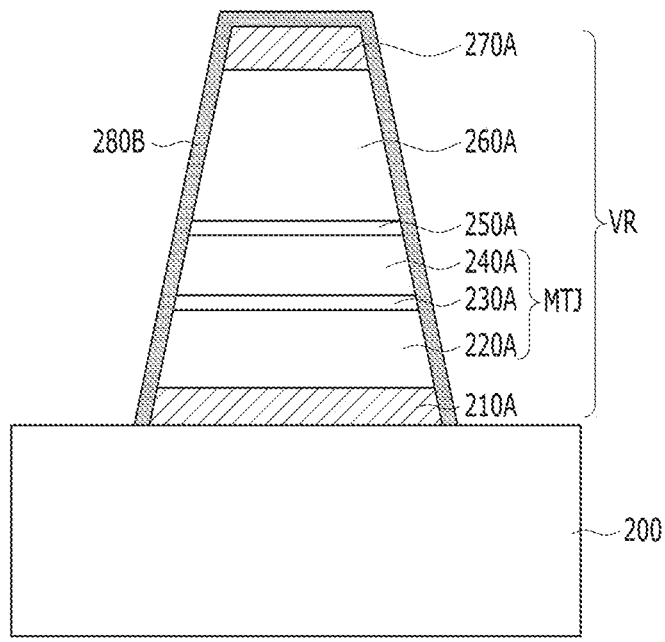

Referring to FIG. 2D, a treatment using a gas or plasma which includes nitrogen and hydrogen, for example, $NH_3$ gas or plasma may be performed to a resultant structure of FIG. 2C.

In this treatment, the metal oxide of the middle spacer 280A may be reduced by the presence of hydrogen due to the treatment and the chemical reaction between the metal oxide and the gas transforms the reacted metal oxide into a metal and by products. Also, the oxidized portion of the variable resistance element VR may be reduced as a result of this treatment. This process may be represented by a following formula (1) in the example of using NHx for the treatment:

$$MO_x + NH_3 \rightarrow M + H_2O + N_2 \qquad (1)$$

In the above formula (1), 'M' represents a metal included in the middle spacer 280A or the variable resistance element VR.

When the oxidized portion of the variable resistance element VR is reduced, problems caused by the oxidized portion of the variable resistance element VR can be solved. For example, a sidewall damage of the variable resistance element VR may be cured and an abnormal metal oxide of an upper portion of the upper electrode layer pattern 270A may be removed. As a result, the deterioration of the characteristics due to the surface oxidation of the variable resistance element VR may be restored.

Meanwhile, in this treatment, a portion or all of the metal oxide of the middle spacer 280A may be reduced, and thus a metal may be formed. This metal or a remaining portion of the metal oxide may be transformed into a metal nitride or metal oxynitride by the presence of nitrogen in the treatment. Hence, a final spacer 280B including the metal nitride or metal oxynitride may be formed. A following formula (2) shows that a metal is transformed into a metal nitride by nitrogen.

$$M + N_2 \rightarrow MN \qquad (2)$$

Therefore, if the metal M is a material which has an insulating property by nitridation and/or oxidation, the final spacer 280B may have an insulating property. For example, the metal M may include Fe, Hf or Al, and the final spacer 280B may include FeN, HfN, AlN, FeON, HfON or AlON, which has an insulating property.

During the treatment using hydrogen and nitrogen, the surface oxidation of the variable resistance element VR may be suppressed to secure the characteristics of the variable resistance element VR, and at the same time, the insulating property of the final spacer 280B may be secured to prevent a leakage current through the final spacer 280B. Furthermore, since the final spacer 280B is transformed to include a metal nitride or metal oxynitride, various characteristics of the variable resistance element VR, for example, a stress applied to the variable resistance element VR may be modified or adjusted.

After this treatment, a resultant structure of FIG. 2D may be exposed to the air, and thus a portion or all of the final spacer 280B may be oxidized again. At this time, this oxidation process in the air is a natural oxidation, and thus an oxidation intensity of this oxidation may be lower than that of the above oxidation process shown in FIG. 2C and the variable resistance element VR protected by the final spacer 280B may not be oxidized.

Figure 2E:
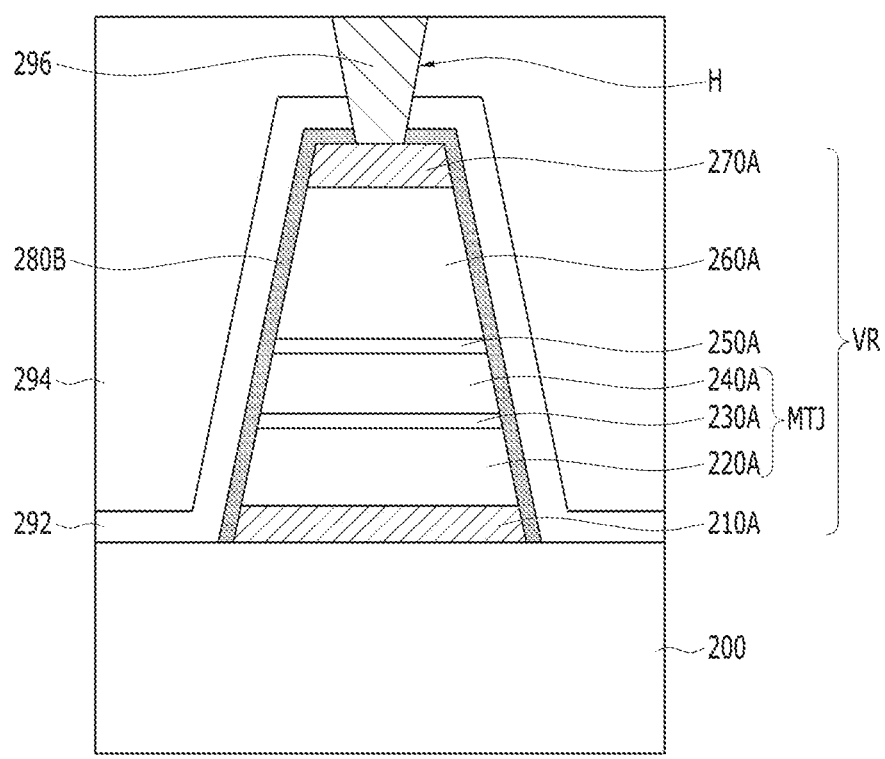

Referring to FIG. 2E, a protective layer 292 for protecting the variable resistance element VR may be formed over a resultant structure of FIG. 2D. The protective layer 292 may be formed of or include an insulating material such as a silicon nitride. In some implementations, the protective layer 292 may be omitted.

Then, an interlayer insulating layer 294 may be formed to cover the protective layer 292. The interlayer insulating layer 294 may be formed by depositing an insulating material and performing a planarization process. The interlayer insulating layer 294 may be formed of or include an insulating material which is different from the protective layer 292, for example, a silicon oxide.

Then, an upper contact plug 296 coupled to the variable resistance element VR may be formed by selectively etching the interlayer insulating layer 294, the protective layer 292 and the final spacer 280B to form a hole H which exposes an upper surface of the variable resistance element VR, that is, an upper surface of the upper electrode layer pattern 270A, and filling the hole H with a conductive material. The upper electrode layer pattern 270A may include a conductive material with an excellent filling property and a high electrical conductivity, for example, a metal such as W or Ta, a metal nitride such as TiN, etc.

Then, although not shown, a line coupled to the upper contact plug 296, for example, a bit line may be formed over the interlayer insulating layer 294 and the upper contact plug 296.

By the aforementioned processes, a semiconductor memory shown in FIG. 2E may be formed.

Referring again to FIG. 2E, a semiconductor memory according to an implementation may include the variable resistance element VR located over the substrate 200 and the final spacer 280B formed over the surface of the variable resistance element VR. The variable resistance element VR may include the lower electrode layer pattern 210A, the free layer pattern 220A, the tunnel barrier layer pattern 230A, the pinned layer pattern 240A, the exchange coupling layer pattern 250A, the magnetic correction layer pattern 260A and the upper electrode layer pattern 270A. The final spacer 280B may include a nitride or an oxynitride of a metal included in the variable resistance element VR. Specially, the final spacer 280B may mainly include a nitride or an oxynitride of a metal included in the lower electrode layer pattern 210A. This metal nitride or metal oxynitride may have an insulating property.

The variable resistance element VR is structure to exhibit different resistance states of different resistance values for representing different data for data storage. A resistance state of the variable resistance element may be switched between different resistance states by applying a voltage or current to the variable resistance element VR through a lower contact plug (not shown) formed in the substrate 200 and the upper contact plug 296. The variable resistance element VR may store data as the magnetization direction of the free layer pattern 220A is changed according to the voltage or current applied to the variable resistance element VR and the changed magnetization direction of the free layer pattern 220A is compared to the magnetization direction of the pinned layer pattern 240A. When the magnetization directions of the free layer pattern 220A and the pinned layer pattern 240A are parallel to each other, the variable resistance element VR may be in a low resistance state and, for example, may store data '1'. Conversely, when the magnetization directions of the free layer pattern 220A and the pinned layer pattern 240A are anti-parallel to each other, the variable resistance element VR may be in a high resistance state and, for example, may store data '0'. The magnetization direction of the free layer pattern 220A may be changed by spin transfer torque. In some implementations, the variable resistance element VR may store data '0' when the magnetization directions of the free layer pattern 220A and the pinned layer pattern 240A are parallel to each other and store data '1' when the magnetization directions of the free layer pattern 220A and the pinned layer pattern 240A are anti-parallel to each other.

The magnetization directions of the free layer pattern 220A and the pinned layer pattern 240A may be perpendicular to an interface between layers constituting the variable resistance element VR, for example, an interface between the free layer pattern 220A and the tunnel barrier layer pattern 230A. That is, the variable resistance element VR may have a perpendicular MTJ structure. The magnetization direction of the free layer pattern 220A may be changed between a downward direction and an upward direction. The magnetization direction of the pinned layer pattern 240A may be fixed in a downward direction or an upward direction. The magnetization direction of the magnetic correction layer pattern 260A may be opposite to the magnetization direction of the pinned layer pattern 240A. Therefore, when the pinned layer pattern 240A has a downward magnetization direction, the magnetic correction layer pattern 260A may have an upward magnetization direction. Conversely, when the pinned layer pattern 240A has an upward magnetization direction, the magnetic correction layer pattern 260A may have a downward magnetization direction.

Meanwhile, during the above treatment process using gas or plasma as shown in FIG. 2D, specially, during the treatment process using plasma, an attack may be made on the variable resistance element VR by the plasma. For preventing the attack, a process of strengthening the middle spacer 280A or forming an additional spacer may be further performed before the plasma treatment process of FIG. 2D. An example of a method for forming the additional spacer will be described with reference to FIG. 3. An example of a method for strengthening the middle spacer 280A will be described with reference to FIGS. 4C to 4E.

Figure 3:
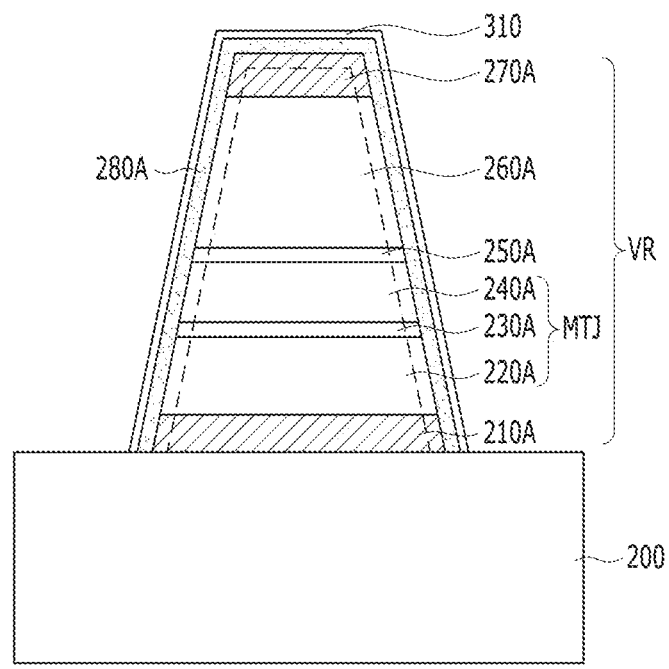
FIG. 3 is a cross-sectional view describing a semiconductor memory and a method for fabricating the same in accordance with another implementation of the present disclosure.

FIG. 3 is a cross-sectional view describing a semiconductor memory and a method for fabricating the same in accordance with another implementation of the present disclosure.

Referring to FIG. 3, the aforementioned process of forming the middle spacer 280A of FIG. 2C may be performed, and then, an additional spacer 310 may be formed over the middle spacer 280A.

The additional spacer 310 may include various insulating materials such as a silicon oxide, a silicon nitride, or a combination thereof. Also, the additional spacer 310 may have a thickness thinner than that of the middle spacer 280A. For example, the additional spacer 310 may have a thickness of 10Å to 100Å. Also, the additional spacer 310 may be porous in comparison with the middle spacer 280A.

Then, although not shown, in a state that the additional spacer 310 is formed, the plasma/gas treatment process of FIG. 2D may be performed, and thus the middle spacer 280A may be transformed into the final spacer 280B.

Here, the additional spacer 310 may prevent an attack on the variable resistance element VR during the plasma/gas treatment process. Furthermore, since the additional spacer 310 has a relatively small thickness and is relatively porous, it may not affect a penetration of the plasma or gas. That is, an efficiency of the plasma treatment/gas process may not be lowered even with the additional spacer 310.

Meanwhile, in the aforementioned implementations, hydrogen and nitrogen are used to suppress a surface oxidation of a variable resistance element, secure an insulating property of a final spacer, and control characteristics of the variable resistance element. However, even when nitrogen only is used except for hydrogen, it is possible to secure an insulating property of a final spacer and control characteristics of a variable resistance element. In this case of using nitrogen only, it may or may not be possible to suppress a surface oxidation of a variable resistance element. This will be described with reference to FIGS. 4A to 4E.

FIGS. 4A to 4E are cross-sectional views describing a semiconductor memory and a method for fabricating the same in accordance with another implementation of the present disclosure.

Figure 4A:
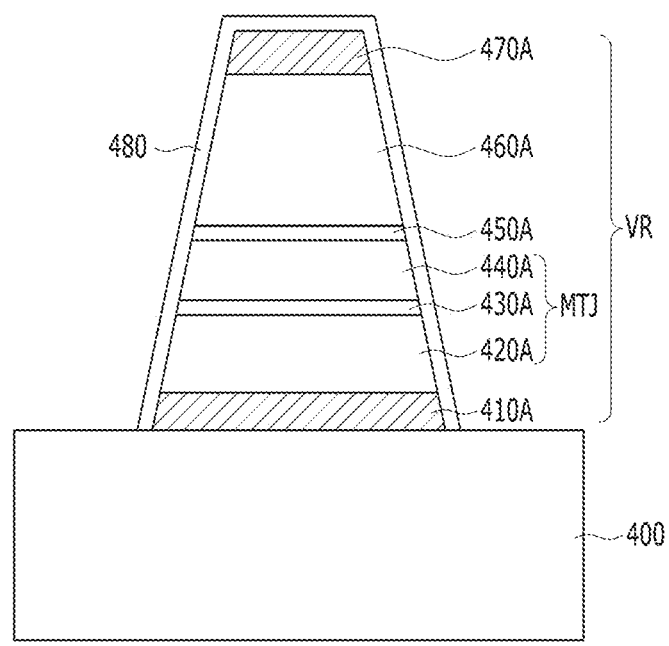
FIGS. 4A to 4E are cross-sectional views describing a semiconductor memory and a method for fabricating the same in accordance with another implementation of the present disclosure.

Referring to FIG. 4A, a variable resistance element VR in which a lower electrode layer pattern 410A, a free layer pattern 420A, a tunnel barrier layer pattern 430A, a pinned layer pattern 440A, an exchange coupling layer pattern 450A, a magnetic correction layer pattern 460A and an upper electrode layer pattern 470A are stacked may be formed over a substrate 400 in which a certain lower structure (not shown) is formed. The variable resistance element VR may be formed by depositing material layers for the lower electrode layer pattern 410A, the free layer pattern 420A, the tunnel barrier layer pattern 430A, the pinned layer pattern 440A, the exchange coupling layer pattern 450A, the magnetic correction layer pattern 460A and the upper electrode layer pattern 470A, and selectively etching the material layers.

Here, during this etching process, etch byproducts may be redeposited over the variable resistance element VR to form an initial spacer 480. The initial spacer 480 may include a metal which is included in the variable resistance element VR. Specially, the initial spacer 480 may mainly contain a metal included in the lower electrode layer pattern 410A which is located at the lowermost portion of the variable resistance element VR.

Figure 4B:
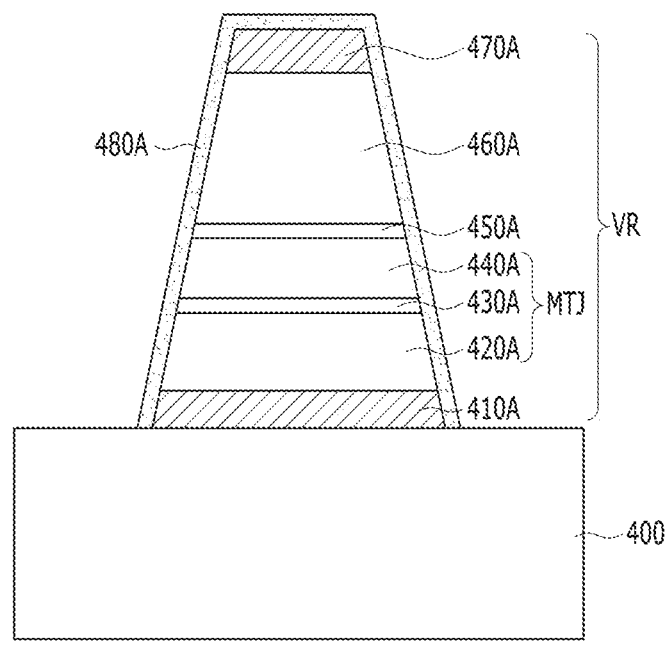

Referring to FIG. 4B, the initial spacer 480 containing a metal may be transformed into a middle spacer 480A containing a metal oxide by performing an oxidation process to a resultant structure of FIG. 4A. The oxidation process of this implementation can include a natural oxidation and/or an over-oxidation process.

As an example, unlike the implementation of FIGS. 2A to 2E, this oxidation process may be insufficiently performed so that the middle spacer 480A does not have a sufficient insulating property. In some implementations, the insufficient oxidation process provides a surface portion of the variable resistance element not oxidized. For example, this oxidation process may be a natural oxidation process. In some implementations, various factors of the oxidation process can be adjusted to provide insufficient oxidation effect. After the oxidation process has been performed, a gas or plasma treatment is performed. If a subsequent nitrogen treatment process is sufficiently performed, the middle spacer 480A may be transformed into a final spacer (see a reference numeral 480B of FIG. 4C) which has a sufficient insulating property. During this oxidation process, a surface oxidation of the variable resistance element VR may be reduced and/or suppressed.

Alternatively, as another example, similar to the implementation of FIGS. 2A to 2E, this oxidation process may include at least one over-oxidation process so that the middle spacer 480A has a sufficient insulating property. In this case, for example, only a first oxidation process may be performed, or a first oxidation process and a second oxidation process may be performed. Here, the first oxidation process may be an over-oxidation process. Alternatively, the first oxidation process may be a natural oxidation process, and the second oxidation process may be an over-oxidation process which is performed by flowing an oxygen gas or an oxygen plasma treatment.

Figure 4C:
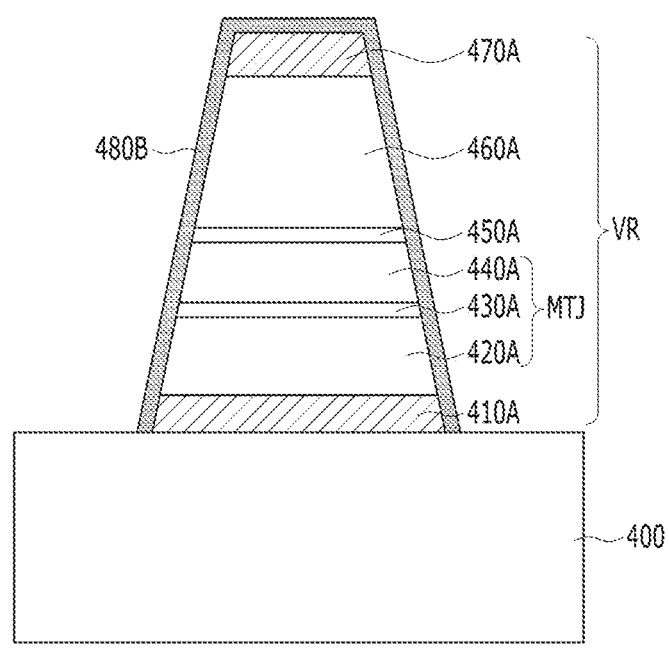
Figure 4D:
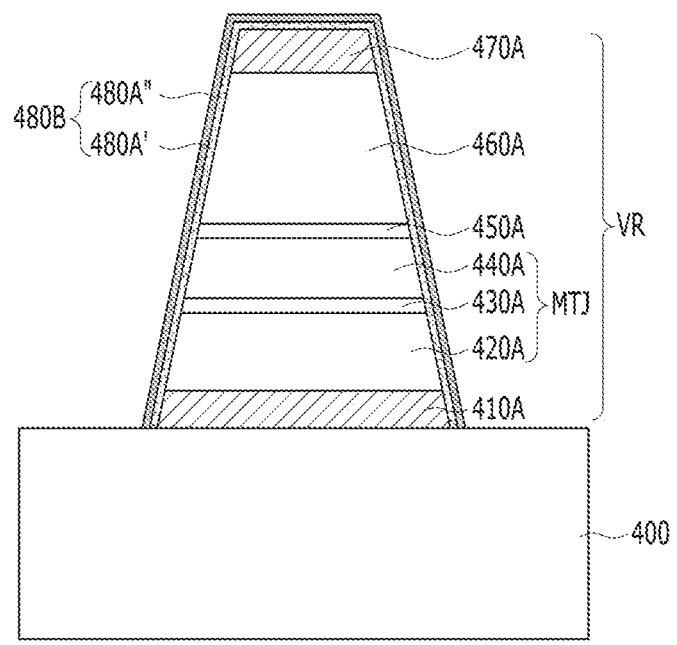

Then, a process of FIG. 4C or FIG. 4D may be selectively performed. The process of FIG. 4D is performed when the middle spacer 48A is not sufficiently oxidized, while FIG. 4C can be performed regardless of the oxidation level of the middle spacer 48.

First, referring to FIG. 4C, a treatment using a gas or plasma which includes nitrogen, for example, $N_2$ gas or plasma may be sufficiently performed to a resultant structure of FIG. 4B. Under this sufficient treatment, all of the middle spacer 480A containing a metal oxide may react with nitrogen, and thus a final spacer 480B including an insulating metal oxynitride may be formed. This treatment of FIG. 4C may be performed in a case that the middle spacer 480A does not have a sufficient insulating property and/or a case that the middle spacer 480A is sufficiently oxidized.

When a plasma/gas treatment is performed to a certain layer, a surface of the certain layer that reacts with the plasma/gas becomes metallic. Therefore, in this nitrogen plasma/gas treatment process, a surface of the final spacer 480B, for example, the outer surface of the final spacer 480B, may have a metallic property, and thus a resistance of the final spacer 480B may be reduced to a certain extent. When the resistance of the final spacer 480B is reduced, characteristic of the variable resistance element VR may be changed. For example, a current through the variable resistance element VR may be reduced. Since the outer surface of the final spacer 480B is not in direct contact with the variable resistance element VR or spaced apart from the variable resistance element VR, a leakage current through the variable resistance element VR may be prevented even if the surface of the final spacer 480B has a metallic property.

Second, referring to FIG. 4D, a treatment using a gas or plasma which includes nitrogen, for example, $N_2$ gas or plasma may be insufficiently performed to a resultant structure of FIG. 4B. Under this insufficient treatment, only a surface portion 480A" of the middle spacer 480A may react with nitrogen to include an insulating metal oxynitride while the remaining portion 480A' of the middle spacer 480A, which is surrounded by the surface portion 480A", may be maintained as a metal oxide included in the middle spacer 480A as a result of the insufficient treatment. The surface portion 480A" and the remaining portion 480A' may be referred to as a final spacer 480B. This treatment may be performed in a case that the middle spacer 480A is sufficiently oxidized in order to prevent a leakage current through the variable resistance element VR. As a result, the final spacer 480B which has a double-layered structure of an insulating metal oxide and an insulating metal oxynitride may be formed over the variable resistance element VR. Meanwhile, in this nitrogen plasma treatment process, a surface of the final spacer 480B may become metallic, and thus a resistance of the final spacer 480B may be reduced to a certain extent. Therefore, characteristic of the variable resistance element VR may be changed. For example, a current through the variable resistance element VR may be reduced.

Meanwhile, if it is determined that the resistance of the final spacer 480B is excessively reduced by the process of FIG. 4C or FIG. 4D, a process for increasing the resistance of the final spacer 480B may be further performed. This will be described with reference to FIG. 4E. In this implementation, a process of FIG. 4E may be performed after the process of FIG. 4C. However, in another implementation, the process of FIG. 4E may be performed after the process of FIG. 4D.

Figure 4E:
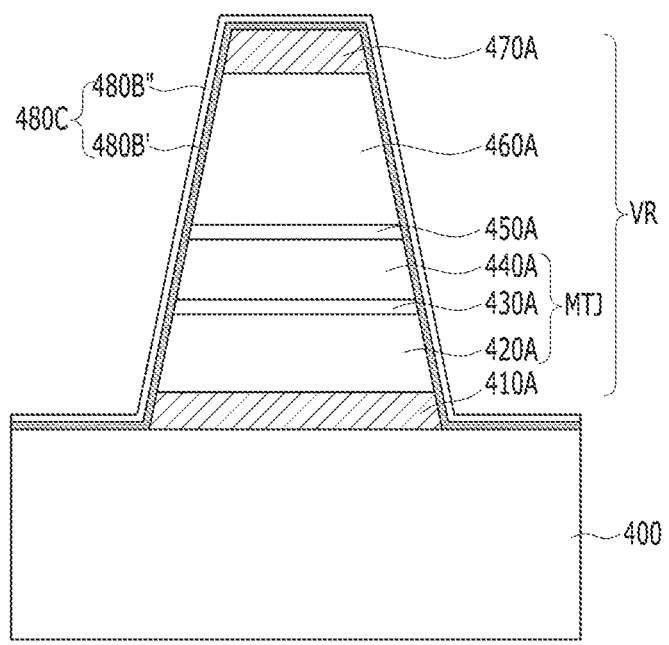

Referring to FIG. 4E, a treatment using a gas or plasma which includes oxygen, for example, $O_2$ gas or plasma may be insufficiently performed to a resultant structure of FIG. 4C. Therefore, a surface portion 480B" of the final spacer 480B may react with oxygen to be transformed into a metal oxynitride containing more oxygen than the final spacer 480B. A remaining portion 480B' of the final spacer 480B, which is surrounded by the surface portion 480B", may be maintained as a metal oxynitride included in the final spacer 480B. The surface portion 480B" and the remaining portion 480B' may be referred to as an additional final spacer 480C. A metallic property of the surface of the final spacer 480B may be reduced or disappear due to this treatment using oxygen. As a result, a resistance of the additional final spacer 480C may be increased compared to the final spacer 480B, and thus a current through the variable resistance element VR may increase again.

Although not shown, when the process of FIG. 4E is performed after the process of FIG. 4D, an additional final spacer may have a double-layered structure including an insulating metal oxide and an insulating metal oxynitride, and a surface of the insulating metal oxynitride may contain more oxygen than a remaining portion of the insulating metal oxynitride.

Meanwhile, by the aforementioned processes for forming a final spacer and/or an additional final spacer shown in FIGS. 4C to 4E, spacers with an increased bonding force and an increased thickness may be obtained through various nitrogen and/or oxygen treatment processes. Therefore, the processes for forming a final spacer and/or an additional final spacer shown in FIGS. 4C to 4E may be further performed after the process of FIG. 2C in order to strengthen the middle spacer 280A. In this case, a damage to the variable resistance element VR by a plasma/gas treatment may be reduced.

The above and other memory circuits or semiconductor devices based on the disclosed technology can be used in a range of devices or systems. FIGS. 5-9 provide some examples of devices or systems that can implement the memory circuits disclosed herein.

Figure 5:
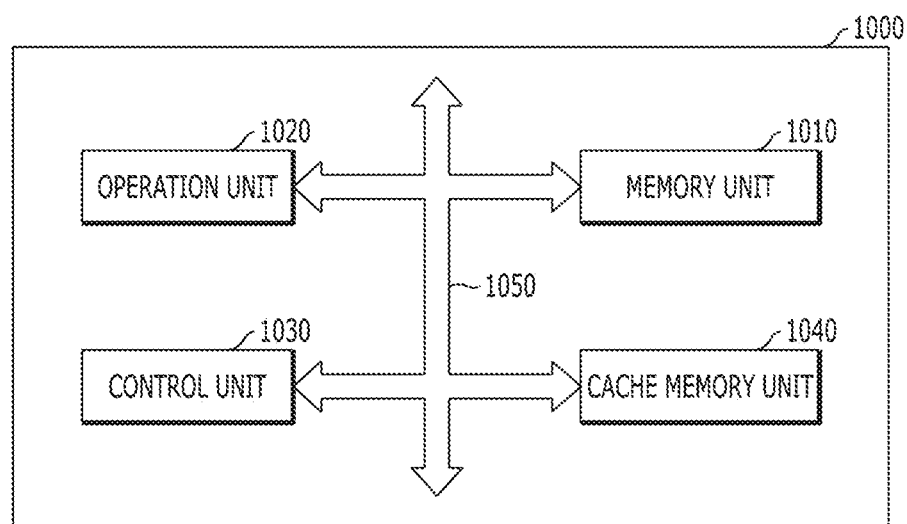
FIG. 5 is an example of configuration diagram of a microprocessor implementing memory circuitry based on the disclosed technology.

FIG. 5 is an example of configuration diagram of a microprocessor implementing memory circuitry based on the disclosed technology.

Referring to FIG. 5, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a variable resistance element including a metal-containing layer and an MTJ (Magnetic Tunnel Junction) structure which is located over the metal-containing layer and includes a free layer having a variable magnetization direction, a pinned layer having a fixed magnetization direction and a tunnel barrier layer interposed between the free layer and the pinned layer; and a spacer formed over the variable resistance element and including a surface portion that includes an insulating metal oxynitride and a remaining portion that is surrounded by the surface portion and includes an insulating metal oxide. Through this, data storage characteristics and operating characteristics of the memory unit 1010 may be improved and fabricating processes may be improved. As a consequence, operating characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 6:
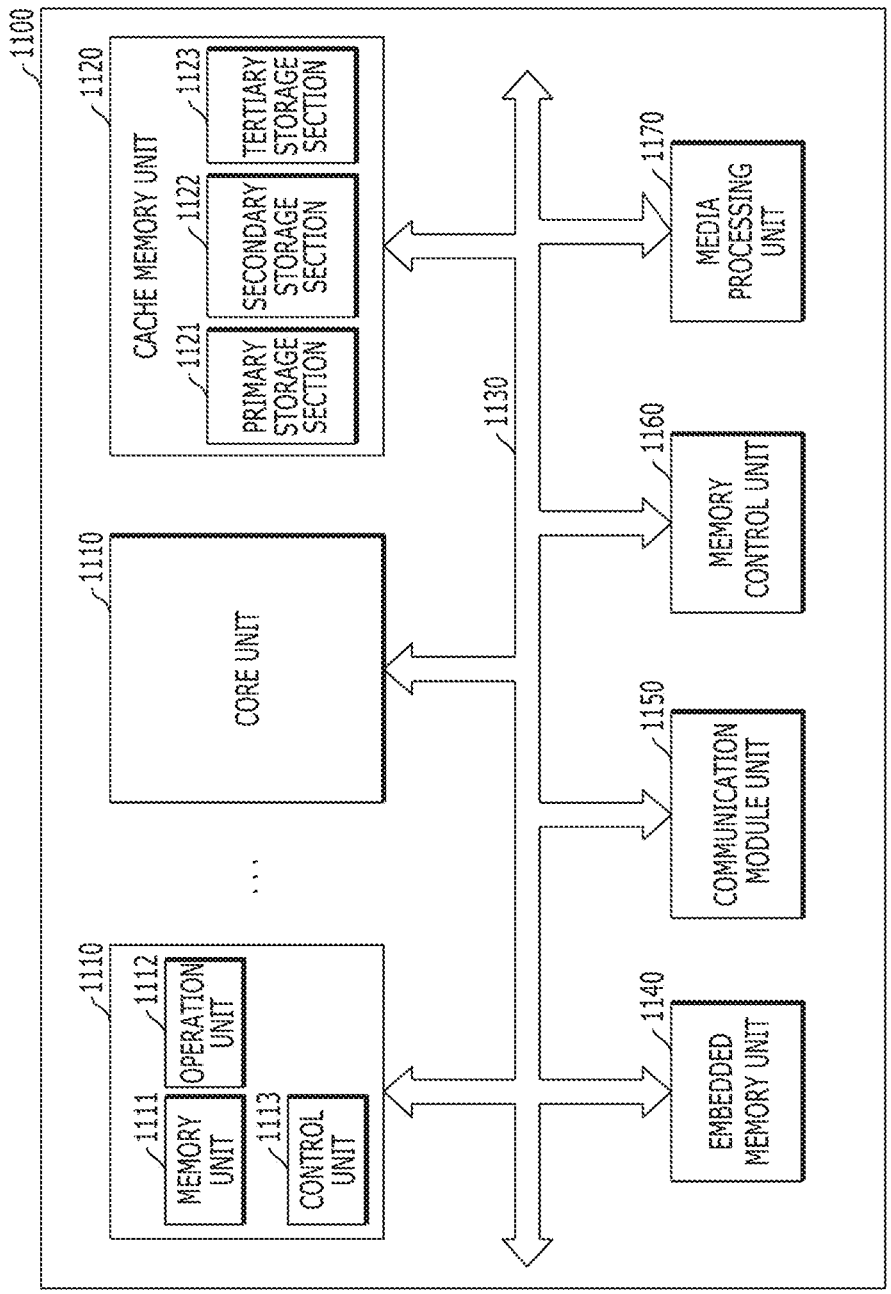
FIG. 6 is an example of configuration diagram of a processor implementing memory circuitry based on the disclosed technology.

FIG. 6 is an example of configuration diagram of a processor implementing memory circuitry based on the disclosed technology.

Referring to FIG. 6, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a variable resistance element including a metal-containing layer and an MTJ (Magnetic Tunnel Junction) structure which is located over the metal-containing layer and includes a free layer having a variable magnetization direction, a pinned layer having a fixed magnetization direction and a tunnel barrier layer interposed between the free layer and the pinned layer; and a spacer formed over the variable resistance element and including a surface portion that includes an insulating metal oxynitride and a remaining portion that is surrounded by the surface portion and includes an insulating metal oxide. Through this, data storage characteristics and operating characteristics of the cache memory unit 1120 may be improved and fabricating processes may be improved. As a consequence, operating characteristics of the processor 1100 may be improved.

Although it was shown in FIG. 6 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 7:
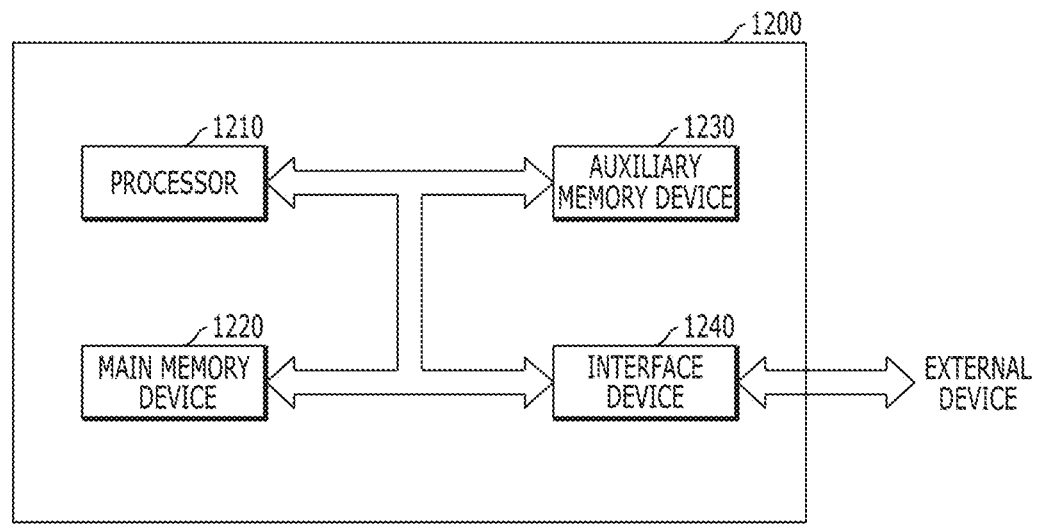
FIG. 7 is an example of configuration diagram of a system implementing memory circuitry based on the disclosed technology.

FIG. 7 is an example of configuration diagram of a system implementing memory circuitry based on the disclosed technology.

Referring to FIG. 7, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a variable resistance element including a metal-containing layer and an MTJ (Magnetic Tunnel Junction) structure which is located over the metal-containing layer and includes a free layer having a variable magnetization direction, a pinned layer having a fixed magnetization direction and a tunnel barrier layer interposed between the free layer and the pinned layer; and a spacer formed over the variable resistance element and including a surface portion that includes an insulating metal oxynitride and a remaining portion that is surrounded by the surface portion and includes an insulating metal oxide. Through this, data storage characteristics and operating characteristics of the main memory device 1220 may be improved and fabricating processes may be improved. As a consequence, operating characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a variable resistance element including a metal-containing layer and an MTJ (Magnetic Tunnel Junction) structure which is located over the metal-containing layer and includes a free layer having a variable magnetization direction, a pinned layer having a fixed magnetization direction and a tunnel barrier layer interposed between the free layer and the pinned layer; and a spacer formed over the variable resistance element and including a surface portion that includes an insulating metal oxynitride and a remaining portion that is surrounded by the surface portion and includes an insulating metal oxide. Through this, data storage characteristics and operating characteristics of the auxiliary memory device 1230 may be improved and fabricating processes may be improved. As a consequence, operating characteristics of the system 1200 may be improved.

Also, the auxiliary memory device 1230 may further include a data storage system (see the reference numeral 1300 of FIG. 8) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 8) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 8:
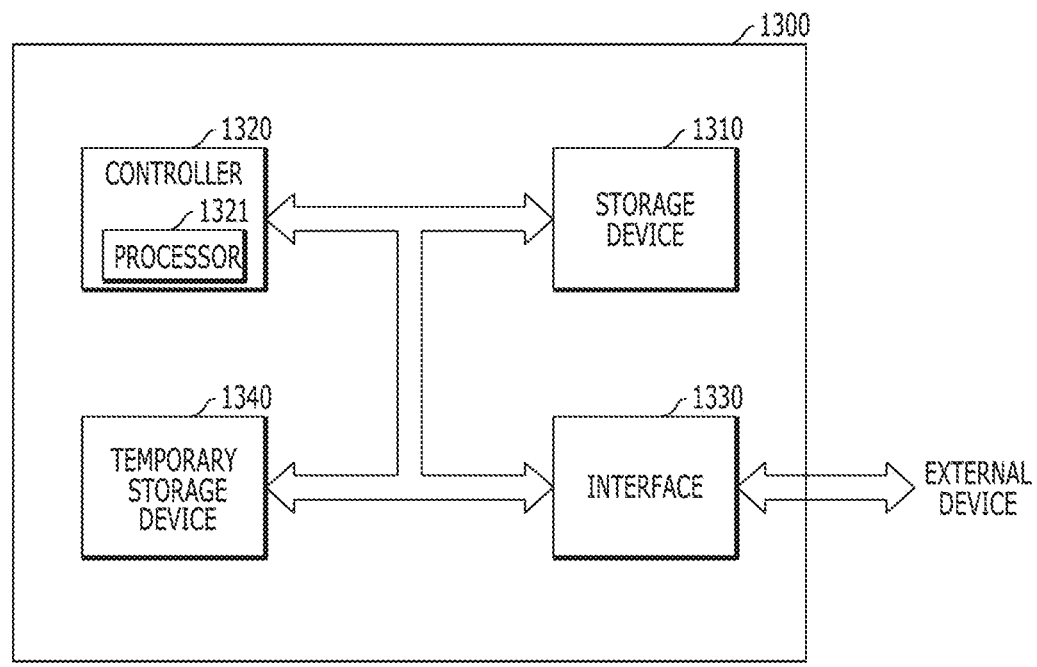
FIG. 8 is an example of configuration diagram of a data storage system implementing memory circuitry based on the disclosed technology.

FIG. 8 is an example of configuration diagram of a data storage system implementing memory circuitry based on the disclosed technology.

Referring to FIG. 8, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include a variable resistance element including a metal-containing layer and an MTJ (Magnetic Tunnel Junction) structure which is located over the metal-containing layer and includes a free layer having a variable magnetization direction, a pinned layer having a fixed magnetization direction and a tunnel barrier layer interposed between the free layer and the pinned layer; and a spacer formed over the variable resistance element and including a surface portion that includes an insulating metal oxynitride and a remaining portion that is surrounded by the surface portion and includes an insulating metal oxide. Through this, data storage characteristics and operating characteristics of the storage device 1310 or the temporary storage device 1340 may be improved and fabricating processes may be improved. As a consequence, operating characteristics and data storage characteristics of the data storage system 1300 may be improved.

Figure 9:
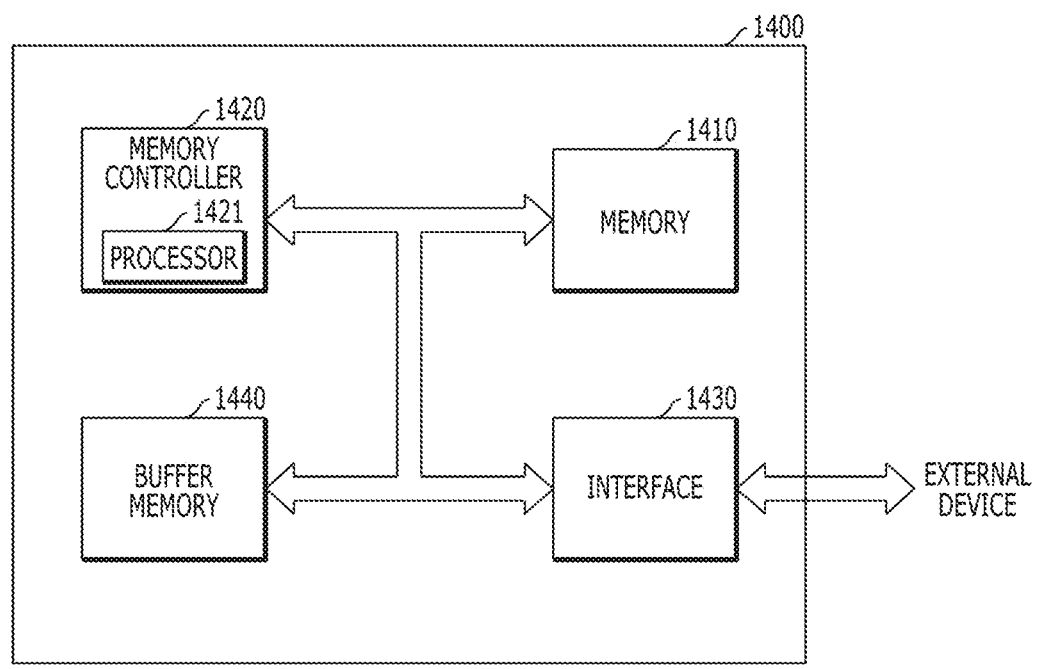
FIG. 9 is an example of configuration diagram of a memory system implementing memory circuitry based on the disclosed technology.

FIG. 9 is an example of configuration diagram of a memory system implementing memory circuitry based on the disclosed technology.

Referring to FIG. 9, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMNIC), a compact flash (CF) card, and so on.

The memory 1410 for storing data may include one or more of the above-described semiconductor devices in accordance with the implementations. For example, the memory 1410 may include a variable resistance element including a metal-containing layer and an MTJ (Magnetic Tunnel Junction) structure which is located over the metal-containing layer and includes a free layer having a variable magnetization direction, a pinned layer having a fixed magnetization direction and a tunnel barrier layer interposed between the free layer and the pinned layer; and a spacer formed over the variable resistance element and including a surface portion that includes an insulating metal oxynitride and a remaining portion that is surrounded by the surface portion and includes an insulating metal oxide. Through this, data storage characteristics and operating characteristics of the memory 1410 may be improved and fabricating processes may be improved. As a consequence, operating characteristics and data storage characteristics of the memory system 1400 may be improved.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a variable resistance element including a metal-containing layer and an MTJ (Magnetic Tunnel Junction) structure which is located over the metal-containing layer and includes a free layer having a variable magnetization direction, a pinned layer having a fixed magnetization direction and a tunnel barrier layer interposed between the free layer and the pinned layer; and a spacer formed over the variable resistance element and including a surface portion that includes an insulating metal oxynitride and a remaining portion that is surrounded by the surface portion and includes an insulating metal oxide. Through this, data storage characteristics and operating characteristics of the buffer memory 1440 may be improved and fabricating processes may be improved. As a consequence, operating characteristics and data storage characteristics of the memory system 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 5-9 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. A method for fabricating an electronic device including a semiconductor memory, comprising:
   forming a variable resistance element over a substrate, the variable resistance element including a metal-containing layer and an MTJ (Magnetic Tunnel Junction) structure which is located over the metal-containing layer and includes a free layer having a variable magnetization direction, a pinned layer having a fixed magnetization direction and a tunnel barrier layer interposed between the free layer and the pinned layer;
   forming an initial spacer containing a metal over the variable resistance element;
   performing an oxidation process to transform the initial spacer into a middle spacer including an insulating metal oxide; and
   performing a treatment using a gas or plasma including nitrogen and hydrogen to transform the middle spacer produced by the oxidation process into a final spacer including an insulating metal nitride or an insulating metal oxynitride.

2. The method according to claim 1, wherein the performing of the oxidation process includes performing an over-oxidation process, and providing an oxidized surface portion of the variable resistance element.

3. The method according to claim 2, wherein the performing of the treatment includes reducing the oxidized surface portion of the variable resistance element.

4. The method according to claim 2, wherein the performing of the oxidation process further includes performing a natural oxidation.

5. The method according to claim 1, wherein the initial spacer and the metal-containing layer include the metal.

6. The method according to claim 1, further comprising, after performing of the oxidation process and before the performing the treatment, forming an additional spacer over the middle spacer.

7. The method according to claim 6, wherein the additional spacer has a thickness thinner than that of the middle spacer.

8. The method according to claim 6, wherein the additional spacer is porous in comparison with the middle spacer.

9. The method according to claim 6, wherein the additional spacer includes a silicon oxide, a silicon nitride or a combination thereof.

10. The method according to claim 1, further comprising, after performing of the oxidation process and before the performing the treatment, performing a first treatment using a gas or plasma which includes nitrogen to a surface portion or whole of the middle spacer.

11. The method according to claim 10, further comprising, after performing of the oxidation process and the first treatment and before the performing the treatment, performing a second treatment using a gas or plasma which includes oxygen.

12. The method of claim 1, wherein the performing of the oxidation process includes oxidizing a portion of the variable resistance element.

13. The method of claim 12, wherein the performing of the treatment includes reducing the oxidized portion of the variable resistance element.

* * * * *